United States Patent [19]

Shen et al.

[11] Patent Number: 5,665,641
[45] Date of Patent: Sep. 9, 1997

[54] METHOD TO PREVENT FORMATION OF DEFECTS DURING MULTILAYER INTERCONNECT PROCESSING

[75] Inventors: Lewis Shen; Robin W. Cheung, both of Cupertino, Calif.

[73] Assignee: Advanced Micro Devices, Inc., Sunnyvale, Calif.

[21] Appl. No.: 528,365

[22] Filed: Sep. 14, 1995

Related U.S. Application Data

[63] Continuation of Ser. No. 330,489, Oct. 28, 1994, abandoned.
[51] Int. Cl.⁶ .................................................. H01L 21/28
[52] U.S. Cl. ...................... 438/643; 438/671; 438/952
[58] Field of Search ............................. 437/187, 192, 437/194, 245, 246; 156/655

[56] References Cited

U.S. PATENT DOCUMENTS

| | | | |
|---|---|---|---|
| 4,561,168 | 12/1985 | Pitzer et al. | 437/194 |
| 4,786,962 | 11/1988 | Koch | 437/194 |
| 4,816,115 | 3/1989 | Hörner et al. | 156/651 |
| 4,820,611 | 4/1989 | Arnold, III et al. | 430/271 |
| 4,974,055 | 11/1990 | Haskell | 357/71 |
| 4,977,108 | 12/1990 | Haskell | 437/229 |
| 5,028,555 | 7/1991 | Haskell | 437/57 |
| 5,055,427 | 10/1991 | Haskell | 437/203 |
| 5,057,902 | 10/1991 | Haskell | 357/71 |
| 5,081,516 | 1/1992 | Haskell | 357/42 |
| 5,169,803 | 12/1992 | Miyakawa | 437/194 |
| 5,250,468 | 10/1993 | Matsuura et al. | 437/194 |
| 5,270,254 | 12/1993 | Chen et al. | 437/194 |
| 5,308,794 | 5/1994 | Tu | 437/194 |

OTHER PUBLICATIONS

S. Wolf, "Silicon Processing for the VLSI Era, vol. 2", Lattice Press, 1990, pp. 194–199.
F.E. Chen et al., "Planarized Aluminum Metallization for Sub–0.5 μm CMOS Technology", IEDM Digest of Technical Papers, paper 3.4.1 (IEEE, Dec. 1990), pp. 51–54.

Primary Examiner—John Niebling
Assistant Examiner—Thomas G. Bilodeau
Attorney, Agent, or Firm—Benman Collins & Sawyer

[57] ABSTRACT

A process is provided for forming a hard mask over an aluminum-containing layer for patterning and etching the aluminum-containing layer to define interconnects. The process comprises depositing the material comprising the hard mask at a temperature that is within the range of about 100° C. below the sputtering temperature of the aluminum-containing metal and the sputtering temperature of the aluminum-containing metal.

7 Claims, 1 Drawing Sheet

METHOD TO PREVENT FORMATION OF DEFECTS DURING MULTILAYER INTERCONNECT PROCESSING

This is a continuation of application Ser. No. 08/330,489 filed on Oct. 28, 1994, now abandoned.

TECHNICAL FIELD

The present invention relates generally to multilevel interconnects employed in semiconductor technology, and, more particularly, to fabricating sub-micrometer metal interconnects while avoiding the formation of defects during multilevel interconnect processing.

BACKGROUND ART

The need to have hard masks for metal etching has become critical for the semiconductor industry. The need is driven by the depth of field requirement of the lithography process. Since higher numerical aperture (NA) is used for sub-micrometer processing, the depth of field of the resolution drops proportionally. Therefore, to obtain good process control, a thinner resist must be used. However, thinner resists cause metal etching problems, because the metal etch chemistry exhibits poor selectivity to the resist. This, in turn, causes difficulties in control of critical dimensions (CD).

A hard mask has been devised by some workers in this field to combat this problem. The hard mask could be silicon dioxide or silicon nitride. Typically, the hard mask is deposited by plasma enhanced chemical vapor deposition (PECVD). The accepted industry process operates at about 350° to 400° C., which is adequate if the hard mask is a "stand-alone" mask (i.e., the mask, not being a photoresist material, does not have any interaction with previous processing steps).

An aluminum-based alloy is still the material of choice for the interconnects which makes electrical contact to metal plug contacts in silicon-based semiconductor devices. These Al alloys may be doped with Si, Cu, or Ti, or may be pure Al. However, if these Al alloy films as deposited are subjected to a high temperature treatment, then they exhibit a phenomenon called "sunken grain". The reason for this behavior is related to thermal stress. When the film is in sheet form, there is no X-Y movement possible; the only direction for stress-relief is in the Z-direction. When the Al alloy film is heated to high temperature, higher than its original deposition temperature, then the film will be under zero stress. However, during cooling, tensile stresses develop. Since the film is restricted in the X- and Y-directions, then it can only relax in the Z-direction. This relaxation forms "voids" inside the aluminum film, which are associated with the "sunken grain" phenomenon. These void show up as "rings" on the substrate after the aluminum is etched.

After the aluminum film is patterned and etched to form the metal interconnects, then a passivation layer is deposited on the metal interconnects. The metal interconnects are then compressed in all three directions: X, Y, and Z. In this case, voids will not form unless the device is stored at a temperature in the range of about 150° to 200° C. for an extended period of, say, 1,000 hours.

Voids will form inside the aluminum-containing layer under high temperature conditions, whether the aluminum is doped or undoped, regardless of whether the aluminum sheet is covered by a conventional TiN anti-reflection coating (ARC) or not. If no TiN ARC is in place, these defects, which will be transferred onto the oxide substrate as "rings" upon completion of the metal etch, may not be detrimental. However, if the metal stack to be etched has TiN or another anti-reflection coating formed on the Al-containing layer, then, due to the interaction of ARC and Al around the void region, the ring defects on oxide surfaces become difficult to etch and can cause metal bridging.

Thus, a process for using a hard mask for patterning the aluminum-containing interconnects that avoids the foregoing problems is required.

DISCLOSURE OF INVENTION

In accordance with the invention, a process is provided for forming a hard mask over an aluminum-containing layer for patterning and etching the aluminum-containing layer to define interconnects. The process comprises depositing the material comprising the hard mask at a temperature that is related to the sputtering temperature $T_s$ used to deposit the aluminum-containing metal. Specifically, the hard mask is deposited at a temperature within the range of (a) about 100° C. below the sputtering temperature of the aluminum-containing metal and (b) less than the sputtering temperature of the aluminum-containing metal. In other words, the hard mask deposition temperature $T_m$ is given by:

$$(T_s-100) \leq T_m \leq T_s.$$

Use of the process of the invention prevents the formation of voids in the aluminum-containing interconnects or rings on the oxide substrate when the metal stack is etched.

Other objects, features, and advantages of the present invention will become apparent upon consideration of the following detailed description and accompanying drawings, in which like reference designations represent like features throughout the FIGS.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

The sole FIGURE is a cross-sectional view depicting use of a hard mask in patterning and defining metal interconnects.

BEST MODES FOR CARRYING OUT THE INVENTION

Figure 1:
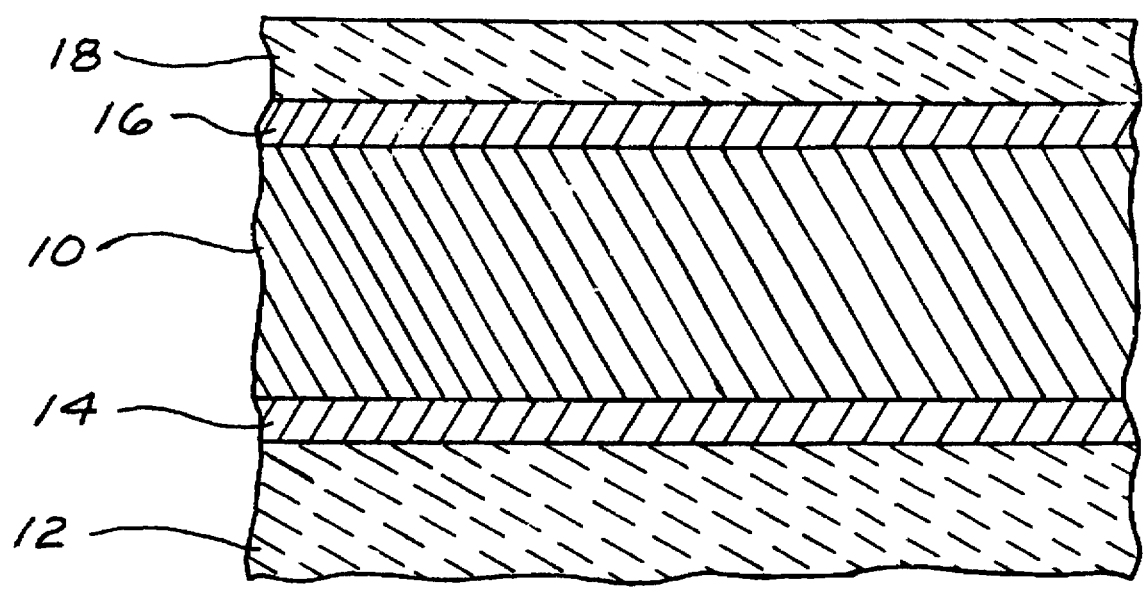

Reference is now made in detail to a specific embodiment of the present invention, which illustrates the best mode presently contemplated by the inventors for practicing the invention. Alternative embodiments are also briefly described as applicable.

The present invention is directed to the process of forming the hard mask with respect to sub-micrometer requirements. In order to avoid the defect formation, the hard mask must be deposited at a lower temperature than the deposition temperature of the interconnect metalization. This will eliminate the formation of the defects.

The deposition of the aluminum-containing interconnect layer is typically carried out by sputtering at an elevated temperature $T_s$. The temperature required for depositing the hard mask should be as low as possible, but no more than about 100° C. less than the sputtering temperature $T_s$, and may range as high as the sputtering temperature, so long as it does not exceed that temperature. The temperature $T_m$ at which the mask is deposited is thus given by $(T_s-100) \leq T_m \leq T_s$.

Too high a difference ($T_s$-100) will cause the metalization to be under high compression during cooling and thereby will cause other types of undesirable defects, such as protrusion and hillocks.

In addition to limiting the upper range of the deposition of the hard mask, the deposition of ARC should also be no higher than the Al deposit temperature.

The sole FIGURE depicts a region of the semiconductor device relating to the interconnect. As shown in the FIGURE, a metal layer 10 comprising an aluminum-containing alloy is formed over an oxide layer 12. For purposes of the present application, the aluminum-containing may consist essentially of pure aluminum (i.e., undoped Al), or may consist essentially of aluminum doped with, e.g., silicon, copper, or titania as is well-known.

The oxide layer 12 is in turn supported over a silicon substrate (not shown). An optional barrier layer 14 of titanium or titanium/titanium nitride (Ti/TiN) provides controlled crystallization of the Al alloy and may be interposed between the oxide layer 12 and the interconnect layer 14. The details of the aluminum interconnect layer 10 formed on the titanium-containing layer 14, in turn formed on the oxide layer 12 are disclosed in a series of patents issued to Jacob D. Haskell and assigned to the same assignee as the present invention. The patents include U.S. Pat. Nos. 4,974,055; 4,977,108; 5,028,555; 5,055,427; 5,057,902; and 5,081,516.

In patterning the aluminum-containing interconnect layer 10, an anti-reflection coating (ARC) 16 is first deposited on the interconnect layer, followed by formation of the hard mask 18 thereon, which may comprise silicon dioxide or silicon nitride. The presence of the ARC 16 is a process aid during patterning of the interconnect layer 10, to prevent surface reflection of light used during the photolithography from interfering with the process. This aspect of the process is also well-known and is disclosed and claimed in U.S. Pat. No. 4,820,611, issued to William H. Arnold, III et al, and assigned to the same assignee as the present application.

The hard mask 18 is deposited on the ARC 16. The thicknesses of the ARC 16 (250 to 1,300 Å) and hard mask 18 (1,000 to 4,000 Å) are the same as in the prior art processes. A photoresist layer (not shown) is deposited on the hard mask 18 and is subsequently exposed to electromagnetic radiation of the appropriate wavelength and developed. Depending on the nature of the resist (positive or negative), the developed or undeveloped portions are removed, thereby exposing portions of the surface of the underlying oxide 18. Next, those exposed portions are removed by etching to expose corresponding portions of the surface of the ARC 16, which in turn are also removed by etching. The process is repeated to exposed corresponding portions of the surface of the interconnect layer 10, which are then removed by etching to form the desired interconnect pattern.

The etchants used in the etching of the hard mask 18, the ARC 16, and the aluminum-containing interconnect layer 10 are well-known in this art and do not form a part of this invention. Specifically, for plasma-etching the hard mask 18, a mixture of $CHF_3$ (20 to 200 sccm) plus $CF_4$ (5 to 50 sccm) is employed at a power of 200 to 2,000 Watts and a pressure of 10 to 100 milliTorr. For plasma-etching the aluminum-containing interconnect layer 10, a mixture of $Cl_2$ (10 to 100 sccm) and $BCl_3$ (10 to 100 sccm) is employed at a power of 100 to 1,000 Watts and a pressure of 5 to 200 milliTorr. The etching of the anti-reflection layer is performed with conventional fluorine-based chemistry.

The sequential etching of the layers as described above results in the transfer of a desired interconnect pattern from the oxide layer 18 to the interconnect layer 10. These process steps are all well-known, and do not form a part of this invention.

As indicated above, the interconnect layer 10 is deposited, such as by sputtering, at a given temperature. According to the teachings of the present invention, the hard mask 18, as well as the anti-reflection coating 16, are deposited at a temperature that does not exceed the deposition temperature of the interconnect layer 10 and may range as much as 100° C. below the deposition temperature of the interconnect layer.

In this manner, defects (voids, rings, etc.) are not formed in the interconnect layer 10 or on oxide layer 12 during the steps of patterning and defining the aluminum-containing interconnects.

INDUSTRIAL APPLICABILITY

The process of the invention for preventing the formation of defects during multi-layer processing of interconnects is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for preventing the formation of defects in aluminum-containing interconnects formed over a semiconductor substrate and employed in silicon-based semiconductor devices, said semiconductor substrate having a surface, wherein said interconnects are formed by:

(a) depositing an aluminum-containing interconnect layer over a first oxide layer supported over a silicon substrate at a first temperature $T_s$, said aluminum-containing interconnect layer having only one degree of freedom for movement in the direction perpendicular to said surface of said semiconductor substrate;

(b) forming an anti-reflection coating on said aluminum-containing interconnect layer at a second temperature $T_{ARC}$, wherein $T_{ARC}$ is measured in °C. and is given by $(T_s-100) \leq T_{ARC} \leq T_s$;

(c) depositing a hard mask on said anti-reflection coating at a third temperature $T_m$ wherein $T_m$ is measured in °C. and is given by $(T_s-100) \leq T_m \leq T_s$;

(d) patterning said hard mask to form an interconnect pattern for transfer to said aluminum-containing interconnect layer; and (e) etching in succession said hard mask, said anti-reflection coating, and said aluminum-containing interconnect layer to transfer said interconnect pattern from said hard mask to said aluminum-containing interconnect layer, thereby forming said aluminum-containing interconnects, thereby preventing the formation of voids in said aluminum-containing interconnect layer or ting defects on said first oxide layer while avoiding compression of said aluminum-containing interconnect layer during cooling.

2. The process of claim 1 wherein said aluminum-containing interconnect consists essentially of undoped aluminum or doped aluminum.

3. The process of claim 2 wherein said doped aluminum consists essentially of aluminum doped with a metal selected from the group consisting of silicon, copper, or titanium.

4. The process of claim 1 wherein said hard mask consists essentially of a material selected from the group consisting of an oxide and a nitride.

5. The process of claim 4 wherein said oxide consists essentially of silicon dioxide and wherein said nitride consists essentially of silicon nitride.

6. The process of claim 1 wherein a barrier layer is interposed between said first oxide layer and said aluminum-containing interconnect layer.

7. The process of claim 6 wherein said barrier layer comprises a material selected from the group consisting of titanium and titanium/titanium nitride.

* * * * *